United States Patent [19]

Tobin

[11] Patent Number: 5,049,418

[45] Date of Patent: Sep. 17, 1991

[54] BARRIER COATINGS FOR OXIDATION PROTECTION INCORPORATING COMPATIBILITY LAYER

[75] Inventor: Albert G. Tobin, Smithtown, N.Y.

[73] Assignee: Grumman Aerospace Corporation, Bethpage, N.Y.

[21] Appl. No.: 656,433

[22] Filed: Feb. 19, 1991

[51] Int. Cl.⁵ ............................................. C23C 16/00
[52] U.S. Cl. ............................ 427/250; 427/255.7; 427/405; 427/419.1
[58] Field of Search ................ 427/250, 255.7, 405, 427/419.1; 428/615

[56] References Cited

U.S. PATENT DOCUMENTS

| | | | |
|---|---|---|---|
| 4,142,023 | 2/1979 | Bernstein et al. | 427/405 |
| 4,555,275 | 11/1985 | Torin | 427/610 |
| 4,933,239 | 6/1990 | Olson et al. | 428/615 |

Primary Examiner—Shrive Beck
Assistant Examiner—Benjamin L. Utech
Attorney, Agent, or Firm—Pollock, VandeSande & Priddy

[57] ABSTRACT

The present method produces a ductile oxidation-resistant surface for titanium aluminides and alloys that involves the introduction of a refractory metal diffusion barrier that is metallurgically compatible with the alloy substrate. The diffusion barrier is then coated with an intermediate copper bonding layer. The copper layer is subsequently coated with either a nickel or a nickel-based superalloy layer. If necessary, a fourth protective layer of iron-based superalloy can be used to form a protective oxide scale on exposure to a high temperature oxidizing medium. Or, the fourth layer may be nickel aluminide which forms an oxidation-resistant external layer. The advantage of this approach is that it creates oxidation-resistant surface and prevents embrittlement of the alloy substrate during high temperature oxidation exposure due to degrading coating-substrate interactions.

7 Claims, 1 Drawing Sheet

---

| EXTERNAL OXIDATION RES. LAYER<br>Fe Superalloy or Al<br>20 |
|---|
| INTERMED OXIDATION RES. LAYER<br>Ni or Ni Superalloy<br>18 |
| COMPATABILITY Cu LAYER<br>16 |
| BARRIER LAYER Nb or Ta<br>14 |
| Ti SUBSTRATE<br>12 |

| EXTERNAL OXIDATION RES. LAYER |
| Fe Superalloy or Al |
| 20 |

| INTERMED OXIDATION RES. LAYER |
| Ni or Ni Superalloy |
| 18 |

| COMPATABILITY Cu LAYER |
| 16 |

| BARRIER LAYER Nb or Ta |
| 14 |

| Ti SUBSTRATE |
| 12 |

BARRIER COATINGS FOR OXIDATION PROTECTION INCORPORATING COMPATIBILITY LAYER

FIELD OF THE INVENTION

The present invention relates to oxidation protection for metals, and more particularly to titanium alloys and titanium aluminides operating at high temperatures.

RELATED CO-PENDING APPLICATIONS

The following co-pending applications are commonly assigned and relate to protective coatings for titanium alloys and aluminides: Ser. No. 07/656,440, 07/656,453, 07/656,495.

BACKGROUND OF THE INVENTION

High temperature, lightweight aerospace structural composites are required for high Mach number airframes and next generation propulsion systems requiring high strength-to-weight and stiffness-to-weight ratios. Titanium alloys and titanium aluminides are attractive materials for this application. Although considerable effort has gone into alloy and metal matrix composite development, the applicability of these advanced structural materials at elevated temperatures will ultimately depend on their resistance to the oxidizing gases that are an integral part of their operating environment. This is due to the sensitivity of the mechanical properties of titanium alloys to oxygen embrittlement. Because of the high solubility (i.e., 30 at. %) and diffusivity of oxygen in titanium at elevated temperatures, exposure to an oxidizing environment leads to the growth of a non-protective oxide film that becomes a source for oxygen dissolution into the alloy substrate.

Significant reductions in ductility, fatigue and creep properties of titanium alloys and titanium aluminides may occur since oxygen concentrations exceeding 1 at. % in the alloy matrix are sufficient to cause significant loss in ductility and fracture toughness. It is thus expected that under operating conditions cracks will nucleate and propagate from such an embrittled surface layer. The application of overlay coatings to protect against oxidation may also lead to localized embrittlement of the substrate and subsequent loss of mechanical properties due to either interdiffusion and/or brittle intermetallic compound formation at the coating-substrate interface. In addition, thermal and/or mechanical strains (i.e., fatigue) that may occur during usage can lead to cracking or spallation of the coating with subsequent loss of protectiveness. Surface modifications that provide oxidation protection over a wide range of operating conditions and which do not degrade substrate mechanical properties are needed to fulfill the high temperature structural potential of titanium alloys and titanium aluminides.

In the prior art successful surface modifications were developed for vanadium-base alloys for use in oxidizing gases in fusion reactor blanket applications. It was shown that surface alloying of vanadium base-alloys with chromium was effective in preventing both oxygen absorption and oxygen diffusion into the alloy substrate in moist He environments. This principle was applied to surface protection of several commercial titanium alloys and $\alpha_2$ titanium aluminides in which aluminum was diffused into the alloy via a vapor transport process and led to a significant improvement in cyclic air oxidation resistance up to 815.C. However, it was also shown that this process may also lead to some reduction in tensile properties of the substrate.

BRIEF DESCRIPTION OF THE PRESENT INVENTION

A novel method is provided for surface modification that not only improves high temperature oxidation resistance but also preserves the baseline fatigue and fracture properties of titanium alloys in high temperature oxidizing environments.

In order to provide an oxidation-resistant surface on titanium alloys that does not degrade mechanical properties of the baseline material, it is necessary to eliminate the potentially damaging effects of the coating-substrate interactions via the introduction of a series of ductile layers on the surface. The unique feature of this disclosure is that a barrier layer is included to prevent the formation of brittle intermetallic compounds at the substrate-barrier interface. This is needed to guarantee that the titanium alloy substrate will not be embrittled by the oxidation-resistant coating and to prevent the formation of a nonprotective titanium oxide film on exposure to the oxidizing environment. The choice of materials and processing steps to apply the ductile barrier layer to create an oxidation-resistant surface alloyed layer constitute the main features of this disclosure.

BRIEF DESCRIPTION OF THE FIGURE

The above-mentioned objects and advantages of the present invention will be more clearly understood when considered in conjunction with the accompanying drawing, in which:

the figure is a diagrammatic illustration of a titanium material substrate and a plurality of oxidation protection layers.

DETAILED DESCRIPTION OF THE INVENTION

Either of the pure refractory metals Nb or Ta have been selected to act as a preferred diffusion barrier layer 14 in contact with the titanium alloy substrate 12. The choice of these metals is based upon their lack of brittle intermetallic compound formation with titanium, their high ductility and their low titanium diffusivity. Other refractory metals may be used, including vanadium, tungsten, and hafnium. Upon selection of a barrier material, one must be cognizant of the requirement that dissolution of barrier material in the substrate material is undesirable. This would result in the formation of brittle metal compounds. Actual choices of refractory metals normally require the designer to consult phase diagrams for various Ti and refractory metal combinations. Such diagrams are useful in determining whether metals will dissolve into one another to form compounds.

An intermediate ductile layer 16 of copper is applied to the Nb or Ta diffusion barrier layer. Copper is selected because it is metallurgically compatible with Nb and Ta in that it does not form brittle intermetallic compounds with either metal. Additionally, copper is compatible with an intermediate oxidation-resistant layer 18 that consist of either Ni or nickel-based superalloys such as Inconel, Udimet, or HastalloyX. A fourth layer 20 serving as an oxidation-resistant outer metal layer that is compatible with the nickel layer, and consisting of an iron-based superalloy composition such as FeCrAlY, may also be applied. In lieu of the latter-mentioned superalloy comprising an oxidation-resistant outer metal fourth layer 20, the substrate covered with three coatings can be subjected to a coating of pure aluminum. The resultant aluminizing treatment forms an oxidation-resistant nickel aluminide that provides additional oxidation protection for the titanium substrate.

The diffusion barrier and Cu layers as well as the coating layers may be created by a variety of conventional coating process including, but not exclusively limited to sputtering, electroplating, chemical vapor deposition, physical vapor deposition, ion beam techniques and/or combinations of these techniques. Vacuum heat treatments of surface alloy coated parts in the range 700°–1100° C. for periods of up to 24 hours may be required to achieve the desired bonding of the layers on the surface. The choice of heat treat time and temperature is dictated by the particular surface alloy composition of interest. The thickness of the layers is dictated by the ambient oxidizing exposure conditions of time and temperature and oxidizing gas.

EXAMPLES Example 1

A titanium alloy (i.e., Ti-6Al-4V) or titanium aluminide (i.e., Ti-24Al-11Nb) substrate surface is prepared by either mechanical polishing or by chemical cleaning in a nitric acid-hydrofluoric acid etch. A 5–10$\mu$m diffusion barrier layer of Nb or Ta is vapor deposited on the substrate. An intermediate subsequent compatibility matching layer of 5–10$\mu$m of Cu is vapor or electrodeposited on the Nb or Ta layer. A nickel-based superalloy oxidation-resistant layer (e.g. Rene 41) is vapor deposited on the copper layer. The three layers are vacuum annealed at 700°–1000° C. for 1–4 hours to form a strong metallurgical bond.

EXAMPLE 2

If the external oxidation-resistant layer is composed of an Fe-based superalloy, then the layering sequence is
1. Nb or Ta diffusion layer
2. Cu intermediate compatibility matching layer
3. Ni or Ni-based superalloy oxidation-resistant layer
4. Fe-based superalloy oxidation-resistant layer

EXAMPLE 3

A titanium alloy substrate is sequentially coated with Nb, Cu, and Ni as described in Example 1. The sample is then suspended into a vacuum chamber containing a crucible with pure aluminum. The crucible is heated to between 900°–1150° C. for 1–4 hours. The aluminizing treatment then forms an oxidation-resistant nickel aluminide (i.e., NiAl or Ni$_3$Al) that provides additional oxidation protection for the titanium substrate.

In the above-mentioned examples, layer thickness can vary between 2–10$\mu$m. In this manner complete metallurgical compatibility between the layers and the titanium alloy substrate is assured since no brittle intermetallic compounds are formed at the respective interfaces of any of the layers. In addition, the layers are composed of ductile metals or alloys and therefore will not lead to degradation of the mechanical properties of the substrate alloy on exposure to a high temperature oxidizing environment.

In summary, the present method produces a ductile oxidation-resistant surface for titanium aluminides and alloys that involves the introduction of a refractory metal diffusion barrier that is metallurgically compatible with the alloy substrate. The diffusion barrier is then coated with an intermediate copper bonding layer. The copper layer is subsequently coated with either a nickel or a nickel-based superalloy layer. If necessary, a fourth protective layer of iron-based superalloy can be used to form a protective oxide scale on exposure to a high temperature oxidizing medium. Or, the fourth layer may be aluminized to form an oxidation-resistant nickel aluminide. The advantage of this approach is that it creates an oxidation-resistant surface and prevents embrittlement of the alloy substrate during high temperature oxidation exposure due to degrading coating-substrate interactions.

It should be understood that the invention is not limited to the exact details of construction shown and described herein for obvious modifications will occur to persons skilled in the art.

I claim:

1. A coating method for protecting a substrate of titanium material comprising the steps:
   depositing a diffusion barrier layer of refractory metal on the substrate;
   depositing a compatibility layer of preselected metal on the barrier layer;
   depositing an intermediate oxidation-resistant layer of nickel material on the compatibility layer, the compatibility layer maintaining a bond between both the barrier and intermediate oxidation-resistant layers; and
   depositing an outer external oxidizable layer on the intermediate oxidation-resistant layer.

2. The method set forth in claim 1 wherein the barrier layer is selected from the group consisting essentially of niobium tantalum, vanadium, tungsten, and hafnium.

3. The method set forth in claim 1 wherein the compatibility layer is composed of copper.

4. The method set forth in claim 1 wherein the intermediate oxidation-resistant layer is composed of nickel.

5. The method set forth in claim 1 wherein the intermediate oxidation-resistant layer is composed of a nickel alloy.

6. A method as set forth in claim 1 wherein the external oxidizable layer is composed of an iron superalloy.

7. A method as set forth in claim 1 wherein the external oxidizable layer is composed of nickel aluminide.

* * * * *

UNITED STATES PATENT AND TRADEMARK OFFICE
CERTIFICATE OF CORRECTION

PATENT NO. : 5,049,418
DATED : September 17, 1991
INVENTOR(S) : Albert G. Tobin

It is certified that error appears in the above-identified patent and that said Letters Patent is hereby corrected as shown below:

Column 1, line 68, change "815.C." to --815°C.--

Column 4, line 47, after "claim" insert --1--.

Signed and Sealed this

Ninth Day of February, 1993

Attest:

STEPHEN G. KUNIN

*Attesting Officer*    Acting Commissioner of Patents and Trademarks